(12) United States Patent
Tsang

(10) Patent No.: US 8,546,800 B2
(45) Date of Patent: Oct. 1, 2013

(54) THIN FILM TRANSISTOR

(75) Inventor: Jian-Shihn Tsang, New Taipei (TW)

(73) Assignee: Hon Hai Precision Industry Co., Ltd., New Taipei (TW)

(*) Notice: Subject to any disclaimer, the term of this patent is extended or adjusted under 35 U.S.C. 154(b) by 0 days.

(21) Appl. No.: 13/489,449

(22) Filed: Jun. 5, 2012

(65) Prior Publication Data

US 2013/0168667 A1 Jul. 4, 2013

(30) Foreign Application Priority Data

Dec. 30, 2011 (TW) .............................. 100150072 A

(51) Int. Cl.
 *H01L 29/10* (2006.01)
 *H01L 29/12* (2006.01)
(52) U.S. Cl.
 USPC .................. 257/43; 257/59; 257/E29.101
(58) Field of Classification Search
 USPC .............. 257/59, 72, 57, 347, 43, E29.101, 257/E21.119; 438/48, 149, 151
 See application file for complete search history.

(56) References Cited

U.S. PATENT DOCUMENTS

2007/0272926 A1* 11/2007 Deng et al. ..................... 257/59
2010/0032760 A1* 2/2010 Choi et al. .................... 257/347

* cited by examiner

*Primary Examiner* — Chuong A Luu
*Assistant Examiner* — Nga Doan
(74) *Attorney, Agent, or Firm* — Altis Law Group, Inc.

(57) ABSTRACT

A thin film transistor includes a substrate, a gate electrode formed on the substrate, a gate insulating layer formed on the gate electrode, a channel region formed on the gate insulating layer, a source region and a drain region formed at two opposite ends of the channel region, a first etching block layer made of silicon oxide and a second etching block layer made of silicon nitride which are formed in sequence on the channel region. The second etching block layer defines a groove in a center thereof to expose a part of the first etching block layer. The groove divides the second etching block layer into a first region and a second region. A source electrode extends from the source region to the first region. A drain electrode extends from the drain region to the second region.

17 Claims, 2 Drawing Sheets

THIN FILM TRANSISTOR

BACKGROUND

1. Technical Field

The disclosure generally relates to a thin film transistor, and particularly to a bottom gate electrode thin film transistor.

2. Description of Related Art

Nowadays, thin film transistors have been widely used in display devices to make the display devices become thinner and smaller. A typical thin film transistor includes a channel region, and a source region and a drain region formed at two opposite ends of the channel region, respectively. A gate electrode is formed on the channel region. A source electrode and a drain electrode are formed on the source region and the drain region, respectively. The thin film transistor is turned on or turned off by controlling a voltage applied to the gate electrode.

Generally, the source electrode and the drain electrode of the thin film transistor are made of copper or aluminum. However, electrons of Cu and/or Al are easy to migrate into the channel region and/or atoms of Cu and/or Al are easy to diffuse into the channel region to cause a short-circuit failure of the thin film transistor. Therefore, the thin film transistor will have a poor reliability.

What is needed, therefore, is a thin film transistor to overcome the above described disadvantages.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Embodiments of a thin film transistor will now be described in detail below and with reference to the drawings.

Figure 1:
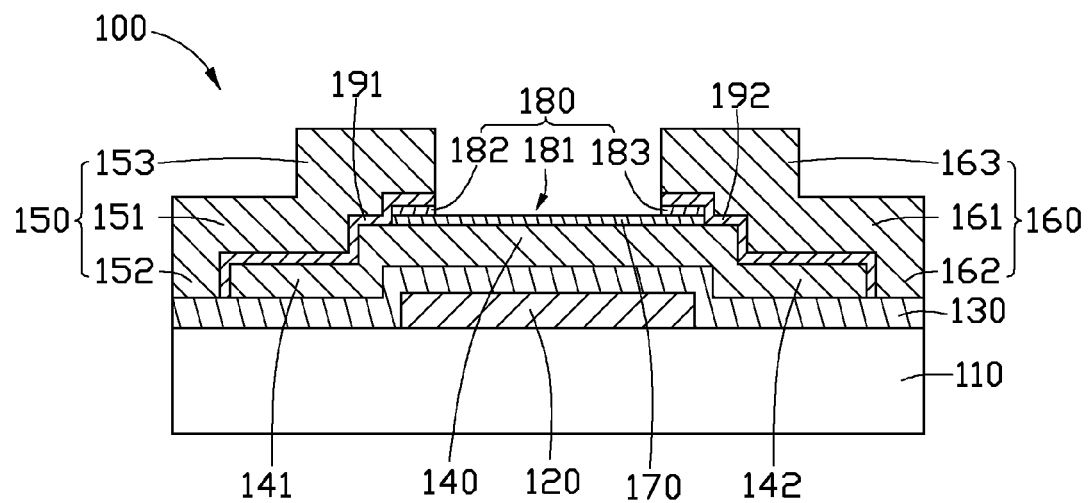
FIG. 1 is a cross-sectional view showing a thin film transistor in accordance with a first embodiment of the present disclosure.

Referring to FIG. 1, a thin film transistor 100 includes a substrate 110, a gate electrode 120, a gate insulating layer 130, a channel region 140, a source region 141, a drain region 142, a source electrode 150, a drain electrode 160, a first etching block layer 170 and a second etching block layer 180. The substrate 110 is made of a material selected from a group consisting of glass, quartz, silicone, polycarbonate and polymethyl methacrylate.

The gate electrode 120 is formed on an upper surface of the substrate 110. In this embodiment, the gate electrode 120 is located on a center of the substrate 110 and below the source and drain electrodes 150, 160. Such a thin film transistor is a bottom gate electrode thin film transistor. The gate electrode 120 can be made of a material selected from Cu, Al, Ni, Mg, Cr, Mo, W, and alloys thereof.

The gate insulating layer 130 is overlapping on an upper surface of the gate electrode 120. In this embodiment, the gate insulating layer 130 extends from the upper surface of the gate electrode 120 to the upper surface of the substrate 110.

The gate insulating layer 130 is made of a material selected from a group consisting of SiOx, SiNx, SiONx. Alternatively, the gate insulating layer 130 can also be made of other insulating materials with a high dielectric constant such as $Ta_2O_5$ or $HfO_2$.

The channel region 140, the source region 141 and the drain region 142 are acted as active layers. The channel region 140 is made of an oxide semiconductor material and formed on an upper surface of the gate insulating layer 130. The oxide semiconductor material is selected from a group consisting of IGZO, ZnO, TiOx, GTO, GZO, AZO, IZO, ITO, ATO, $In_2O_3$, and $SnO_2$.

The source region 141 and the drain region 142 are formed at two opposite ends of the channel region 140, and electrically connected with the source electrode 150 and the drain electrode 160, respectively. In this embodiment, the source electrode 150 includes a main body 151, a first extending section 152 and a second extending section 153. The main body 151 of the source electrode 150 covers the source region 141. The first extending section 152 extends down from the main body 151 and contacts with the gate insulating layer 130. Similarly, the drain electrode 160 also includes a main body 161, a first extending section 162 and a second extending section 163. The main body 161 of the drain electrode 160 extends down from the main body 161 and contacts with the gate insulating layer 130. The source electrode 150 and the drain electrode 160 can be made of a material selected from Cu, Al, Ni, Mg, Cr, Mo, W, and alloys thereof.

The first etching block layer 170 and the second etching block layer 180 are formed in sequence on an upper surface of the channel region 140 and positioned above the gate electrode 120. The first etching block layer 170 is formed between the channel layer 140 and the second etching block layer 180. The second block layer 180 defines a groove 181 at the central portion thereof to expose a part of the first etching block layer 170. The groove 181 divides the second etching block layer 180 into a first region 182 and a second region 183. Preferably, the groove 181 is positioned above the gate electrode 120, and a width of the groove 181 is less than that of the gate electrode 120. The first region 182 and the second region 183 are respectively positioned at two opposite ends of an upper surface of the first etching block layer 170. The second extending region 153 of the source electrode 150 extends from the main body 151 towards the channel region 140, and overlaps on an upper surface of the first region 182 of the second etching block layer 180. The second extending region 163 of the drain electrode 160 extends from the main body 161 towards the channel region 140, and overlaps on an upper surface of the second region 183 of the second etching block layer 180. In this embodiment, the first etching block layer 170 is made of oxide compound and the second etching block layer 180 is made of nitride compound. For example, the second etching block layer 180 is made of SiNx, and the first etching block layer 170 is made of a material selected from SiOx、AlOx、HfOx and YOx. Furthermore, the first etching block layer 170 and the second etching block layer 180 can be made of materials with different dielectric constants or different refractive indexes.

In operation of the thin film transistor 100, different voltages are applied to the gate electrode 120 to control the thin film transistor 100 to turn on or turn off. Because the first etching block layer 170 and the second etching block layer 180 are formed between the source electrode 150 and the channel region 140, and also formed between the drain electrode 160 and the channel region 140, electrons of the source electrode 150 and the drain electrode 160 are not easy to migrate into the channel region 140 and atoms of the source and drain electrodes 150, 160 are not easy to diffuse into the channel region 140. The electron migration and/or atom diffusion of the source and/or drain electrodes 150, 160 into the channel region 140 can cause a short-circuit failure of the thin film transistor 100. Accordingly the thin film transistor 100 according to the present disclosure can have a longer life of use. In addition, the central portion of the second block layer 180 is etched to form the groove 181. Therefore, a residual stress in the second etching block layer 180 caused by a formation of the second etching block layer 180 can be small. Such a small residual stress will avoid the possibility that the residual stress in the second etching block layer can adversely affect the performance of the thin film transistor.

The thin film transistor 100 can further include a first transparent conductive layer 191 and a second transparent conductive layer 192. The first transparent conductive layer 191 is formed at a bottom of the source electrode 150, and between the source electrode 150 and the source region 141, thereby to improve an electrical connection between the source electrode 150 and the source region 141. The second transparent conductive layer 192 is formed at a bottom of the drain electrode 160, and between the drain electrode 160 and the drain region 142, thereby to improve an electrical connection between the drain electrode 160 and the drain region 142. In this embodiment, the first transparent conductive layer 191 further extends to a region between the source electrode 150 and the second etching block layer 180, and the second transparent conductive layer 192 further extends to a region between the drain electrode 160 and the second etching block layer 180.

Figure 2:
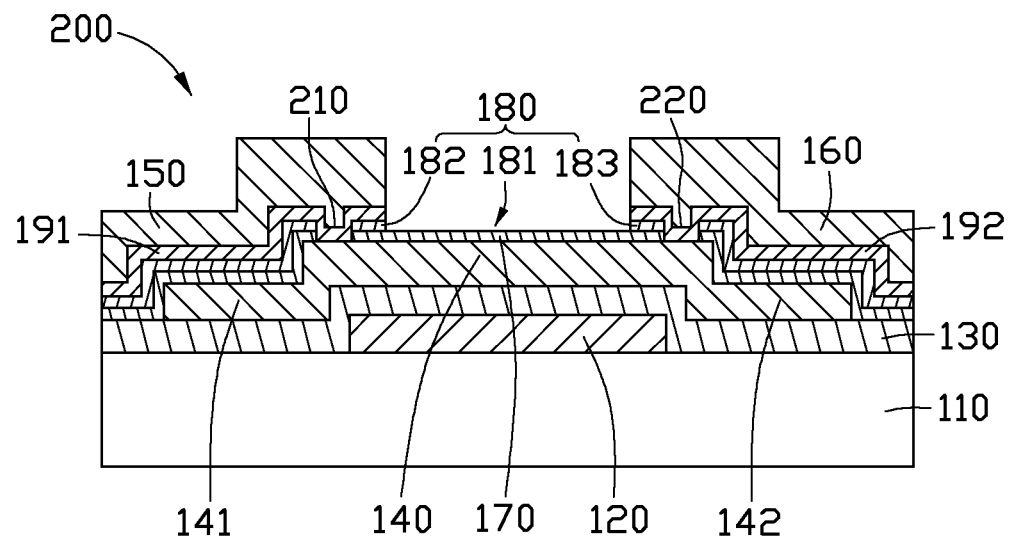
FIG. 2 is cross-sectional view showing a thin film transistor in accordance with a second embodiment of the present disclosure.

The thin film transistor is not limited to the embodiment described above. Referring to FIG. 2, a thin film transistor 200 in accordance with a second embodiment is provided. In the thin film transistor 200, the first etching block layer 170 entirely covers the upper surface of the channel region 140 and extends to contact with the gate insulating layer 130. The first region 182 of the second etching block layer 180 is formed between the source electrode 150 and the channel region 140. The second region 183 of the second block layer 180 is formed between the drain electrode 160 and the channel region 140. A first through hole 210 is defined through the first region 182 and the first etching block layer 170 to reach the source region 141. A second through hole 220 is defined through the second region 183 and the first etching block layer 170 to reach the drain region 142. The source electrode 150 extends into the first through hole 210. The drain electrode 160 extends into the second through hole 220. The first transparent conductive layer 191 is formed in the thin film transistor 200 and positioned at the bottom of the source electrode 150 and extends in the first through hole 210 to form electrical connection between the source electrode 150 and the source region 141. The second transparent conductive layer 192 is formed in the thin film transistor 200 and positioned at the bottom of the drain electrode 160 and extends into the second through hole 220 to form electrical connection between the drain electrode 160 and the drain region 142. In this embodiment, most of the contact between the source electrode 150 and the channel region 140 is separated by the first region 182 of the second etching block layer 180 and the first etching block layer 170, except for the first hole 210 for the source electrode 150 to extend therein. Therefore, the first etching block layer 170 and the first region 182 of the second etching block layer 180 can effectively prevent the electrons/atoms of the source electrode 150 from migrating/diffusing into the channel region 140. Similarly, most of the contact between the drain electrode 160 and the channel region 140 is separated by the second region 183 of the second etching block layer 180 and the first etching block layer 170, except for the second hole 220 for the drain electrode 160 to extend therein. Therefore, the first etching block layer 170 and the second region 183 can effectively prevent the electrons/atoms of the drain electrode 150 from migrating/diffusing into the channel region 140.

It is to be further understood that even though numerous characteristics and advantages of the present embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. A thin film transistor comprising:
   a substrate;
   a gate electrode formed on the substrate;
   a gate insulating layer formed on the gate electrode;
   a channel region formed on the gate insulating layer;
   a source region and a drain region formed at two opposite ends of the channel region, respectively;
   a first etching block layer and a second etching block layer formed in sequence on the channel region, the second etching block layer defining a groove in a center thereof to expose a part of the first etching block layer, the groove dividing the second etching block layer into a first region and a second region; and
   a source electrode extending from the source region to the first region, and a drain electrode extending from the drain region to the second region, the source electrode above the channel region having at least a part thereof which is separated from the channel region by the first etching block layer and the first region of the second etching block layer, the drain electrode above the channel region having at least a part thereof which is separated from the channel region by the first etching block layer and the second region of the second etching block layer,
   wherein the first etching block layer is made of oxide, and the second etching block layer is made of nitride, wherein the first etching block layer is made of a material selected from SiOx, AlOx, HfOx and YOx and wherein the second etching block layer is made of SiNx.

2. The thin film transistor of claim 1, wherein the groove is located above the gate electrode, and the groove has a width less than a width of the gate electrode.

3. The thin film transistor of claim 1, wherein the gate electrode is made of a material selected from a group consisting of Cu, Al, Ni, Mg, Cr, Mo, W, and alloys thereof.

4. The thin film transistor of claim 1, further comprising a first transparent conductive layer and a second transparent conductive layer, the first transparent conductive layer being formed between the source electrode and the source region, the second transparent conductive layer being formed between the drain electrode and the drain region.

5. The thin film transistor of claim 1, wherein the channel region is made of an oxide semiconductor material selected from a group consisting of IGZO, ZnO, TiOx, GTO, GZO, AZO, IZO, ITO, ATO, $In_2O_3$, and $SnO_2$.

6. The thin film transistor of claim 1, wherein the first etching block layer and the second etching block layer have different dielectric constants.

7. The thin film transistor of claim 1, wherein the first etching block layer and the second etching block layer have different refractive indexes.

8. A thin film transistor comprising:
a substrate;
a gate electrode formed on the substrate;
a gate insulating layer formed on the gate electrode;
a channel region formed on the gate insulating layer;
a source region and a drain region formed at two opposite ends of the channel region;
a source electrode and a drain electrode; and
a first etching block layer and a second etching block layer formed in sequence on the channel region, the first etching block layer totally covering the channel region and extending to contact with the gate insulating layer, the second etching block layer defining a groove in a center thereof to expose a part of the first etching block layer, the groove dividing the second etching block layer into a first region and a second region, the first region of the second etching block layer being formed between the source electrode and the first etching block layer, the second region of the second etching block layer being formed between the drain electrode and the first etching block layer, a first through hole being defined through the first region and the first etching block layer to reach the source region, a second through hole being defined through the second region and the first etching block layer to reach the drain region, the source electrode extending into the first through hole to electrically connect with the source region, the drain electrode extending into the second through hole to electrically connect with the drain region;
wherein the source electrode extends from the source region to the first region, and the drain electrode extends from the drain region to the second region.

9. The thin film transistor of claim 8, wherein the first etching block layer is made of oxide, and the second etching block layer is made of nitride.

10. The thin film transistor of claim 9, wherein the first etching block layer is made of a material selected from SiOx、AlOx、HfOx and YOx.

11. The thin film transistor of claim 10, wherein the second etching block layer is made of SiNx.

12. The thin film transistor of claim 8, wherein the groove is positioned above the gate electrode, and the groove has a width less than a width of the gate electrode.

13. The thin film transistor of claim 8, wherein the gate electrode is made of a material selected from a group consisting of Cu, Al, Ni, Mg, Cr, Mo, W, and alloys thereof.

14. The thin film transistor of claim 8, further comprising a first transparent conductive layer formed at a bottom of the source electrode and a second transparent conductive layer formed at a bottom of drain electrode, the first transparent conductive layer extending through the first through hole to electrically connect between the source electrode and the source region, the second transparent conductive layer extending into the second through hole to electrically connect between the drain electrode and the drain region.

15. The thin film transistor of claim 8, wherein the channel region is made of an oxide semiconductor material selected from a group consisting of IGZO, ZnO, TiOx, GTO, GZO, AZO, IZO, ITO, ATO, $In_2O_3$, and $SnO_2$.

16. The thin film transistor of claim 8, wherein the first etching block layer and the second etching block layer have different dielectric constants.

17. The thin film transistor of claim 8, wherein the first etching block layer and the second etching block layer have different refractive indexes.

* * * * *